United States Patent [19]
Chaudhuri

[11] 3,962,609
[45] June 8, 1976

[54] VOLTAGE TRANSFORMER FOR A COMPLETELY INSULATED HIGH-VOLTAGE INSTALLATION

[75] Inventor: Bishwarup Chaudhuri, Berlin, Germany

[73] Assignee: Siemens Aktiengesellschaft, Munich, Germany

[22] Filed: May 17, 1974

[21] Appl. No.: 470,981

[30] Foreign Application Priority Data
May 17, 1973 Germany............................ 2325449

[52] U.S. Cl. ................................. 317/103; 174/28; 323/93
[51] Int. Cl.² ........................ H01B 7/20; H05K 9/00
[58] Field of Search ...................... 324/74; 323/93; 317/12 R, 103, 242, 244; 307/149; 174/22 C, 28

[56] References Cited
UNITED STATES PATENTS

| | | | |
|---|---|---|---|
| 3,610,947 | 10/1971 | Stephanides | 174/28 |
| 3,652,778 | 3/1972 | Sakal | 174/28 |
| 3,763,378 | 10/1973 | Muller | 323/93 |
| 3,801,725 | 4/1974 | Farish | 174/28 |
| 3,829,742 | 8/1974 | Muller | 323/93 |

FOREIGN PATENTS OR APPLICATIONS

| | | | |
|---|---|---|---|
| 1,396,983 | 3/1965 | France | 174/28 |

Primary Examiner—Gerald P. Tolin
Attorney, Agent, or Firm—Kenyon & Kenyon Reilly Carr & Chapin

[57] ABSTRACT

A voltage transformer for a fully-insulated, high-voltage installation with a grounded metal encapsulation includes one electrode arranged in a support insulator which holds the high-voltage conductor centrally in the metal encapsulation. The electrode of the support insulator represents the low-voltage electrode of a high-potential capacitor conjointly defined by this electrode and the high-voltage conductor of the high-voltage installation. The high-potential capacitor and a low-potential capacitor conjointly define a capacitive voltage divider. An amplifier is connected to the low-potential capacitor of the voltage divider.

5 Claims, 5 Drawing Figures

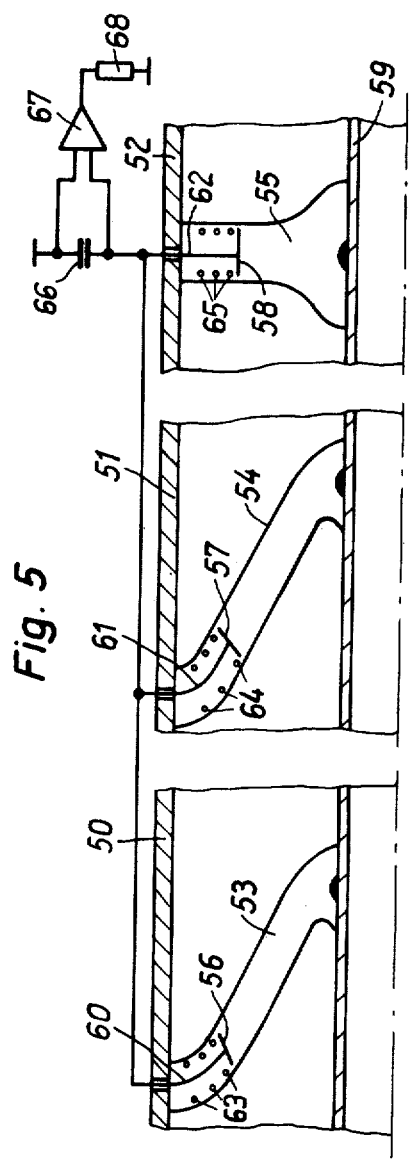

3,962,609

VOLTAGE TRANSFORMER FOR A COMPLETELY INSULATED HIGH-VOLTAGE INSTALLATION

BACKGROUND OF THE INVENTION

The invention relates to a voltage transformer for a fully-insulated, high-voltage installation such as a switching installation having a grounded metal encapsulation. An insulator body is located within the metal encapsulation, and within this insulator, there is embedded an electrode which constitutes the low-voltage electrode of a high-potential capacitor defined by this embedded electrode and the high-voltage conductor of the high-voltage installation. The high-potential capacitor and a low-potential capacitor connected to the high-potential capacitor conjointly define a capacitive voltage divider. An amplifier is connected after the low-potential capacitor.

CIGRE Report 23-02 on the 1972 Session, August 28 to September 6, pages 10 to 12 discloses a voltage transformer of this kind wherein the insulator body consists of an open insulator ring part, in which the electrode is embedded; also embedded in the insulator ring part is a mounting element which protrudes from the insulator ring part and is clamped with its edge, which is bent outward, between flanges of parts of the metal encapsulation. The known voltage transformer has shortcomings inasmuch as it requires a special insulator body for receiving the electrode and, furthermore, a mounting member to hold this insulator body within the metal encapsulation.

SUMMARY OF THE INVENTION

It is therefore an object of the invention to provide a voltage transformer for a completely insulated high-voltage installation with a grounded metal encapsulation which can be produced in a relatively simple manner.

This object is realized in the voltage transformer according to the invention by providing that the insulator body with an embedded electrode is formed by a support insulator which holds the high-voltage conductor centrally in the metal encapsulation of the installation.

The primary advantage of the voltage transformer according to the invention is that no additional insulator body for receiving the electrode forming a high-potential capacitor is required; rather, the support insulator, which is required for holding the high-voltage conductor in the high-voltage switching installation, is at the same time used to receive the electrode. It is merely necessary to embed the electrode in the support insulator during its manufacture, which presents no special problem with support insulators which are generally cast of casting resin. The external shape of the support insulators need not be changed; all commonly used support insulators can therefore be used to build the voltage transformer according to the invention.

The voltage transformer according to the invention is found to be particularly advantageous if the electrode is arranged on an equipotential surface of the electric field between the high-voltage conductor and the metal encapsulation. This embodiment of the voltage transformer has the advantage that no appreciable change of the field is caused in the region of the support insulator by the embedded electrode so that the favorable field distribution achieved through an appropriate construction of the support insulators in the region of the support insulators is little influenced by the embedded electrode.

Arranging the electrode on an equipotential surface of the electric field also makes it possible to configure the electrode in an advantageous manner so that it has areas outside the support insulator; even with a relatively thin-walled support insulator, an electrode with a relatively large surface can therefore be obtained in the voltage transformer according to the invention, which has a favorable effect on the magnitude of the capacity of the high-potential capacitor formed by the electrode and the high-voltage conductor.

The electrode embedded in the support insulator is advantageously connected with the low-potential capacitor, usually arranged outside the metal encapsulation, by means of a connecting line disposed within the support insulator. Particularly if, in an advantageous manner, the connecting line is surrounded by several control electrodes which are embedded in the support insulator and each consists of a thin metallic ring open at one point, and if the control electrodes each are arranged on different equipotential surfaces of the electric field between the high-voltage conductor and the metal encapsulation, the advantageous possibility exists to arrange the electrode also relatively close to the high-voltage conductor because no appreciable degradation of the field pattern in the region of the support insulator is caused by the connecting line surrounded by control electrodes. According to the invention, the electrode can therefore be arranged at different distances from the high-voltage conductor, so that the possibility is afforded to give the high-potential capacitor the capacity desired in each case.

A high-voltage switching installation with a grounded metal encapsulation usually contains not only one, but several support insulators. In high-voltage switching installations of such design it may be advantageous, in order to increase the capacity of the high-potential capacitor, to embed an electrode each in several support insulators and to tie the connecting lines together in order to obtain a high-potential capacitor of large capacity, or to connect the connecting lines jointly to a single subordinated low-potential capacitor followed by an amplifier. It is a requirement that the electrodes in the individual support insulators are situated on corresponding equipotential surfaces.

It is considered advantageous if the electrode is configured as a cylindrical electrode, that is, that it forms, together with the high-voltage conductor, a cylindrical capacitor, whose capacity can be determined relatively easily. However, the electrode may also have a different shape and represent, for instance, a section of a circular cylinder.

Although the invention is illustrated and described herein as a voltage transformer for a completely insulated, high-voltage installation, it is nevertheless not intended to be limited to the details shown, since various modifications may be made therein within the scope and the range of the claims. The invention, however, together with additional objects and advantages will be best understood from the following description and in connection with the accompanying drawings.

BRIEF DESCRIPTION OF THE DRAWINGS

FIG. 1 shows the supporting insulator of the voltage transformer configured as a conical member with the low-voltage electrode embedded therein.

FIG. 5 illustrates still another embodiment of the invention whereby a plurality of supporting insulators are provided which are equipped with respective control electrodes connected in parallel to achieve a greater capacity.

DESCRIPTION OF THE PREFERRED EMBODIMENTS OF THE INVENTION

Figure 1:
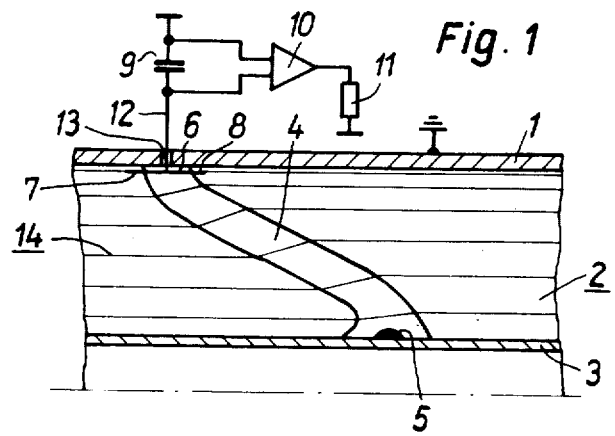
FIG. 1 is a schematic diagram, partially in section, illustrating the voltage transformer according to the invention.

Referring to FIG. 1, a tubular high-voltage conductor 3 is held in a grounded metal encapsulation 1 of a high-voltage installation 2 by a conical support insulator 4 so as to centrally hold the conductor with respect to the metal encapsulation. The support insulator 4 is provided at its end contacting the high-voltage conductor 3 with a metal ring 5 in order to obtain a favorable distribution of the electric field. In its region adjacent to the metal encapsulation 1, there is embedded in the conical support insulator 4 an electrode 6, preferably in the shape of a circular cylinder, which has regions 7 and 8 which are outside the support insulator 4. As the equipotential lines 14 of the electric field show, the electrode 6 is arranged on an equipotential surface of the electric field and therefore causes no appreciable change in the pattern of the electric field lines of force.

Together with the high-voltage conductor 3, the electrode 6 forms a high-potential capacitor of a capacitive voltage divider. To the low-potential capacitor 9 of the capacitive voltage divider, there is connected an amplifier 10. A load 11 is connected to the output of the amplifier 10. A connecting line 12 is brought out through the metal encapsulation 1 through a feedthrough 13 and serves to connect the electrode 6 with the low-potential capacitor 9.

In the embodiment of the voltage transformer according to the invention shown in FIG. 1, the high-potential capacitor formed by the high-voltage conductor 3 and the electrode 6 has in part a solid dielectric of the material of the support insulator and in part a gaseous dielectric, if the metal encapsulation 1 is filled with gas for insulation.

Figure 2:
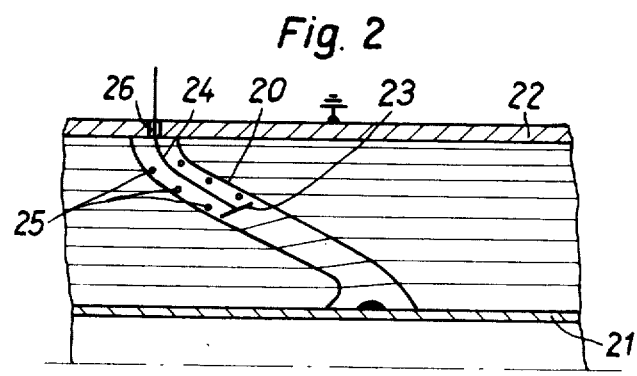
FIG. 2 illustrates an alternate embodiment of the invention wherein the low-voltage electrode is also embedded in a conical supporting insulator.

If a larger capacity of the high-potential capacitor is desired, the electrode, which has preferably the shape of a circular cylinder, is arranged in a manner shown in FIG. 2. In this embodiment, the conical support insulator 20 holds a tubular high-voltage conductor 21 centrally in a grounded metal encapsulation 22. In the conical support insulator 20, there is arranged approximately in the middle of the support insulator, an electrode 23 which, together with the high-voltage conductor 21, forms a high-potential capacitor of a capacitive voltage divider with a low-potential capacitor (not shown) which is followed by an amplifier. In order to avoid field distortion, the electrode 23 is again arranged on an equipotential surface of the electric field and is connected with the low-potential capacitor (not shown) by means of a connecting line 24 which is surrounded by control electrode means in the form of several control electrodes 25. The control electrodes 25 consist of thin, open metal rings, which are likewise arranged on equipotential surfaces of the electric field and prevent field distortion by the connecting line 24. The connecting line 24 is brought through the metal encapsulation 22 in insulated relation thereto by means of a feedthrough 26.

Figure 3:
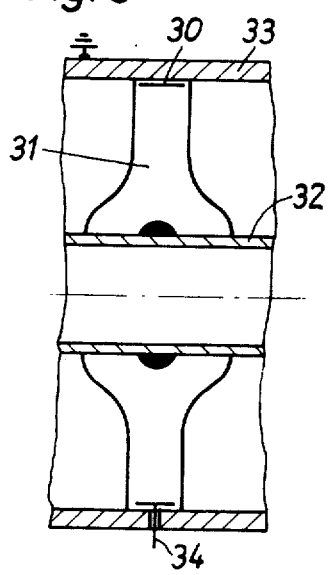
FIG. 3 illustrates an alternate embodiment wherein the supporting insulator has a disc-like configuration.

In the embodiment shown in FIG. 3, an electrode 30, preferably of the shape of a circular cylinder, is embedded in a disc-shaped support insulator 31. The insulator 31 holds a tubular high-voltage conductor 32 centrally on a grounded metal encapsulation 33. The electrode 30 is again connected by means of a connecting line 34 to a low-potential capacitor (not shown). If the electrode 30 is arranged closer to the high-voltage conductor in order to obtain a larger capacity of the high-potential capacitor formed by it and the high-voltage conductor 32, the connecting line 34 is here also advantageously surrounded by control electrodes, which, as the electrode 30, are arranged on equipotential surfaces of the electric field.

Figure 4:
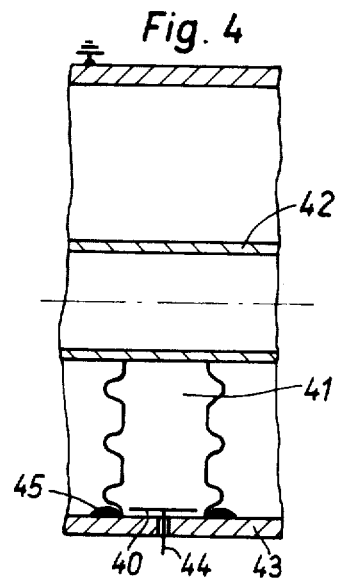
FIG. 4 is still another embodiment of the invention wherein the supporting insulator has a cylindrical configuration.

The embodiment of FIG. 4 essentially differs from what was described above by the provision that the electrode 40 is embedded in a cylindrical support insulator 41, which holds, like the support insulators described above, a high-voltage conductor 42 centrally in a grounded metal encapsulation 43. A connecting line 44 is again brought out in an insulated manner through the metal encapsulation 43 from the electrode 40 to a low-potential capacitor (not shown). A metal ring 45 serves to avoid field concentration.

The embodiment of the voltage transformer according to the invention shown in FIG. 5 shows several sections 50, 51 and 52 of a grounded metal encapsulation, in each of which support insulators 53, 54 and 55, each with embedded electrodes 56, 57 and 58, is arranged for centrally holding a tubular high-voltage conductor 59. Connecting lines 60, 61 and 62 are connected to the electrodes 56, 57 and 58, respectively; and, in order to avoid undesired field distortion, the connecting lines 60, 61 and 62 are surrounded by control electrodes 63, 64 and 65, respectively. The connecting lines 60 to 62 are connected with each other and are jointly connected to a low-potential capacitor 66 followed by an amplifier 67, which is terminated with a load 68. Thereby, a capacitive voltage divider with a high-potential capacitor of relatively large capacity is obtained.

The voltage transformer according to the invention can also be used in a high-voltage switching installation with several high-voltage conductors, in which the individual high-voltage conductors are each supported by a support insulator.

With the invention, a voltage transformer for a completely insulated, high-voltage installation such as a switching installation with a grounded metal encapsulation is obtained which can be produced cost-effectively because of the use of support insulators for centrally holding the high-voltage conductor in the metal encapsulation as the support element for an electrode to form a high-potential capacitor together with the high-voltage conductor.

What is claimed is:

1. In a fully-insulated, high-voltage installation including a grounded metal enclosure and a high-voltage conductor contained in the metal enclosure, a voltage transformer comprising: a supporting insulator centrally supporting the high-voltage conductor in the metal enclosure; a low-voltage electrode embedded in said supporting insulator so as to be in spaced relation to the high-voltage conductor, said low-voltage electrode and the high-voltage conductor conjointly defining a high-voltage capacitor; a low-voltage capacitor connected to said high-voltage capacitor, said high-voltage capacitor and said low-voltage capacitor conjointly defining a capacitive voltage divider; connecting means connecting said low-voltage capacitor to said low-voltage electrode embedded in said support insulator, said connecting means being a connecting lead extending within said supporting insulator; and, control electrode means embedded in said supporting insulator in surrounding relation to said connecting lead whereby a significant alteration of the pattern of the electric field lines within the metal enclosure is precluded.

2. The voltage transformer of claim 1, said control electrode means comprising a plurality of control electrodes embedded in said supporting insulator so as to be in surrounding relation to said connecting lead.

3. The voltage transformer of claim 2 wherein the high-voltage on the high-voltage conductor causes an electric field to be developed between the high-voltage conductor and the metal enclosure, each of said control electrodes being an open thin metal ring, said metal rings being disposed on respectively different equipotential planes of the electric field between the high-voltage conductor and the metal enclosure.

4. In a fully-insulated, high-voltage installation including a grounded metal enclosure and a high-voltage conductor contained in the metal enclosure, the high-voltage on the high-voltage conductor causing an electric field to be developed between the high-voltage conductor and the metal enclosure, a voltage transformer comprising: a supporting insulator centrally supporting the high-voltage conductor in the metal enclosure; a low-voltage electrode embedded in said supporting insulator so as to be in spaced relation to the high-voltage conductor, said low-voltage electrode and the high-voltage conductor conjointly defining a high-voltage capacitor; a low-voltage capacitor connected to said high-voltage capacitor, said high-voltage capacitor and said low-voltage capacitor conjointly defining a capacitive voltage divider; additional supporting insulators, and additional low-voltage electrodes in corresponding ones of said additional supporting insulators so as to be in spaced relation to the high-voltage conductor; said additional low-voltage electrodes and the high voltage conductor conjointly defining respective additional high-voltage capacitors; a plurality of connecting leads corresponding to respective ones of said low-voltage electrodes to connect the same to said low-voltage capacitor, said connecting leads being connected together whereby said high-voltage capacitors are connected in parallel with each other to provide a greater total high-voltage capacity for said capacitive voltage divider, said connecting leads being run in said supporting insulators respectively; and, control electrode means embedded in said supporting insulators, respectively, whereby a significant alteration of the pattern of the electric field lines within the metal enclosure is precluded.

5. In a fully-insulated, high-voltage installation including a grounded metal enclosure and a high-voltage conductor contained in the metal enclosure, the high-voltage on the high-voltage conductor causing an electric field to be developed between the high-voltage conductor and the metal enclosure, a voltage transformer comprising: a supporting insulator centrally supporting the high-voltage conductor in the metal enclosure; a low-voltage electrode embedded in said supporting insulator so as to be in spaced relation to the high-voltage conductor, said low-voltage electrode and the high-voltage conductor conjointly defining a high-voltage capacitor; a low-voltage capacitor connected to said high-voltage capacitor, said high-voltage capacitor and said low-voltage capacitor conjointly defining a capacitive voltage divider; said supporting insulator having a surface engaging the high-voltage conductor, and a metal ring mounted at said surface for obtaining an advantageous distribution of the electric field.

* * * * *